(12) United States Patent
Yadav et al.

(10) Patent No.: US 7,031,600 B2
(45) Date of Patent: Apr. 18, 2006

(54) METHOD AND APPARATUS FOR SILICON OXIDE DEPOSITION ON LARGE AREA SUBSTRATES

(75) Inventors: Sanjay D. Yadav, San Jose, CA (US); Quanyuan Shang, Saratoga, CA (US); Wendell T. Blonigan, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 294 days.

(21) Appl. No.: 10/409,466

(22) Filed: Apr. 7, 2003

(65) Prior Publication Data

US 2004/0194701 A1 Oct. 7, 2004

(51) Int. Cl.
*C23C 14/00* (2006.01)
(52) U.S. Cl. ............ 392/389; 392/386; 392/387; 392/394; 392/397; 392/400; 427/579; 427/166; 118/715; 118/726
(58) Field of Classification Search ........ 392/386–389, 392/394, 397, 399, 400, 402–403; 427/579, 427/166, 255, 370; 118/715, 726
See application file for complete search history.

(56) References Cited

U.S. PATENT DOCUMENTS

| | | | |
|---|---|---|---|
| 4,984,460 A | 1/1991 | Isoda | 73/204.15 |
| 5,078,092 A * | 1/1992 | Antos et al. | 118/726 |
| 5,272,880 A | 12/1993 | Nishizato et al. | 62/50.7 |
| 5,372,754 A | 12/1994 | Ono | 261/142 |
| 5,849,089 A | 12/1998 | Tsunashima et al. | 118/726 |
| 5,865,421 A | 2/1999 | Ono | 251/129.02 |
| 6,167,834 B1 | 1/2001 | Wang et al. | |
| 6,261,374 B1 | 7/2001 | Bang et al. | 118/726 |
| 6,723,964 B1 * | 4/2004 | Hwang et al. | 219/448.11 |

FOREIGN PATENT DOCUMENTS

| | | |
|---|---|---|
| EP | 058571 | 8/1982 |
| EP | 0435088 | 7/1991 |
| JP | 2001-104769 | 4/2001 |

OTHER PUBLICATIONS

Copy of International Search Report dated Oct. 21, 2004 for corresponding PCT application, PCT/US2004/010543.

* cited by examiner

*Primary Examiner*—Shawntina T. Fuqua
(74) *Attorney, Agent, or Firm*—Patterson & Sheridan, LLP

(57) ABSTRACT

A method and apparatus for depositing a dielectric material at a rate of at least 3000 Angstroms per minute on a large area substrate that has a surface area of at least about 0.35 square meters is provided. In one embodiment, the dielectric material is silicon oxide. Also provided is a large area substrate having a layer of dielectric material deposited by a process yielding a deposition rate in excess of about 3000 Angstroms per minute and a processing chamber for fabricating the same.

17 Claims, 5 Drawing Sheets

METHOD AND APPARATUS FOR SILICON OXIDE DEPOSITION ON LARGE AREA SUBSTRATES

BACKGROUND OF THE INVENTION

1. Field of the Invention

Embodiments of the invention generally relate to a method and apparatus for silicon oxide deposition on large area substrates.

2. Background of the Related Art

Thin film transistors (TFTs) are conventionally made on large area glass substrates or plates for use in monitors, flat panel displays, solar cells, personal digital assistants (PDAs), cell phones and the like. Many TFT manufacturers utilize large area substrates for TFT fabrication with dimensions exceeding 550 mm by 650 mm, with a demand for even larger sizes. It is envisioned that these dimensions may exceed 4.0 square meters in the near future.

TFTs are made in a cluster tool by sequential deposition of various films including amorphous silicon, doped and undoped silicon oxides, silicon nitride and the like in vacuum chambers typically disposed around a central transfer chamber. TFTs generally comprise two glass plates having a layer of liquid crystal material sandwiched therebetween. At least one of the glass plates includes at least one conductive film disposed thereon that is coupled to a power supply. Power supplied to the conductive film from the power supply changes the orientation of the liquid crystal material, creating a pattern such as text or graphics seen on the display. One fabrication process frequently used to produce flat panels is plasma enhanced chemical vapor deposition (PECVD).

Plasma enhanced chemical vapor deposition is generally employed to deposit thin films on a substrate such as a flat panel or semiconductor wafer. Plasma enhanced chemical vapor deposition is generally accomplished by introducing a precursor gas into a vacuum chamber that contains a substrate. The precursor gas is typically directed through a distribution plate situated near the top of the chamber. The precursor gas in the chamber is energized (e.g., excited) to form a plasma by applying RF power to the chamber from one or more RF sources coupled to the chamber. The excited gas reacts to form a layer of material on a surface of the substrate that is positioned on a temperature controlled substrate support. In applications where the substrate receives a layer of low temperature polysilicon, the substrate support may be heated in excess of 400 degrees Celsius. Volatile by-products produced during the reaction are pumped from the chamber through an exhaust system.

One of the obstacles in depositing films, particularly silicon oxides formed from TEOS precursors, is the long time required to deposit a predetermined thickness of film on the surface of larger size substrates. In particular, deposition rates slow exponentially as process gases cannot be provided to the chamber at a rate that allows commercially practical deposition rates. For example, conventional vaporizers utilized to convert liquid TEOS into TEOS vapor suitable for CVD processes are limited to about 10 g/m and correspondingly limit deposition rates to about 1500 to about a maximum of 2500 Å/m in typical processes. The lack of generators suitable for providing high volumetric flows of process gases (i.e., flows in excess of 15 g/m) is a major obstacle for commercially practical silicon oxide deposition on next generation size large area substrates.

Further, TEOS vaporizers, such as conventional TEOS bubblers utilized in many large area substrate CVD applications, also tend to generate and entrain liquid droplets at their upper end of operation, which is generally limited to about 10 g/m. Droplets entering the processing chamber may contaminate the substrate and/or result in process variation. As the size of large area substrates commands a substantial investment in material and processing costs, excessive defects due to droplets or inadequate precursor gas generation are unacceptable. Moreover, droplets entrained in the gases entering the processing chamber result in prolonged vacuum pump-down time. For example, conventional large area substrate CVD systems encounter pump-down times of about 23–30 seconds for conventional vaporizers producing 5 g/min TEOS and about 30–34 seconds for conventional vaporizers producing 10 g/min TEOS. Minimization of the pump-down time is highly desirable as it would directly result in increased substrate throughput.

Therefore, is a need for a method and apparatus for generating TEOS vapor (among other precursors or process gases) for depositing dielectric material at a rate of at least 2,000 Å/m on large area substrates.

SUMMARY OF THE INVENTION

A method and apparatus for depositing a dielectric material at a rate of at least 3000 Angstroms per minute on a large area substrate that has a surface area of at least about 0.35 square meters is provided. In one embodiment, the dielectric material is silicon oxide. Also provided is a large area substrate having a layer of dielectric material deposited by a process yielding a deposition rate in excess of about 3000 Angstroms per minute and a processing chamber for fabricating the same.

In another aspect of the invention, a vaporizer module suitable for use in semiconductor processing is provided. In one embodiment, includes a first thermally conductive plate having a thickness of at least 0.125 disposed against a second plate thermally conductive plate to define a vaporizer assembly. A plurality of grooves are formed at least partially in the first plate and covered by the second plate. A first port and a second port are formed in respective ends of the vaporizer assembly and fluidly coupled by the grooves.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
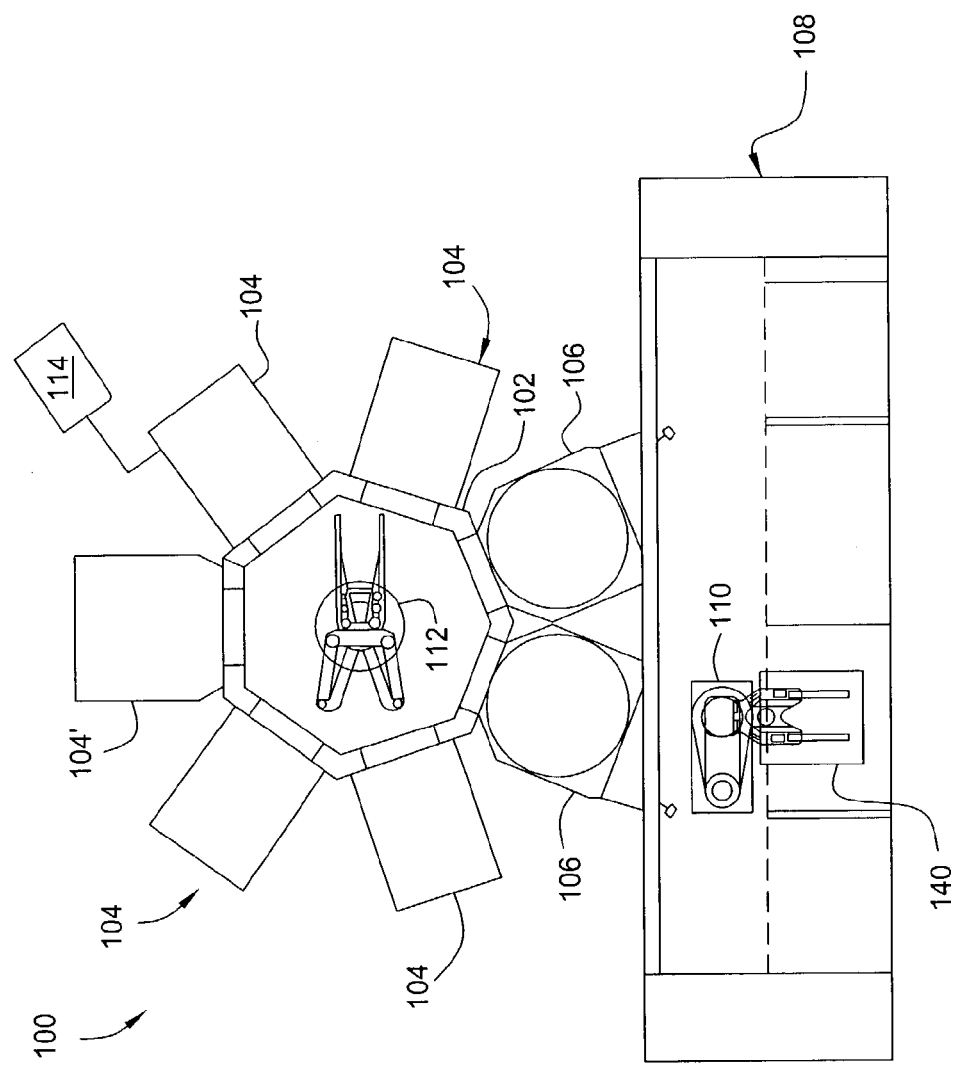
FIG. 1 is a sectional view of an exemplary large area substrate processing system including one embodiment of a vaporizer module of the present invention.

FIG. 1 is a top sectional view of one embodiment of a plasma enhanced chemical vapor deposition system 100 adapted to deposit dielectric material on large area substrates at a rate in excess of 3000 and up to and exceeding 14,000 angstroms per minute. Typically, large area substrates have a surface area (on one side) greater than or equal to about 0.35 square meters. The system 100 generally includes a central transfer chamber 102 having a plurality of processing chambers 104 coupled thereto. Optionally, one of the processing chambers 104 may be a heating chamber 104'. At least one load lock chamber 106 is coupled between the transfer chamber 102 and a factory interface 108 to facilitate transfer of substrates 140 between the factory interface 108 and the processing chambers 104 (two are shown). The system 100 also includes an interface robot 110 disposed in the factory interface 108 and a transfer robot 112 disposed in the transfer chamber 102 to enable substrate movement through the load lock chambers 106 and around the system 100. One large area substrate processing system that may be adapted to benefit from the invention is an AKT-5500 plasma enhanced chemical vapor deposition (PECVD) system, available from AKT, a division of Applied Materials, Inc., located in Santa Clara, Calif.

Each processing chamber 104 is adapted for processing a large area substrate and typically has a volume of at least about 360 liters. Each processing chamber 104 is typically coupled to a respective gas delivery system 114. The gas delivery system 114 generally provides, process gas to the processing chamber. Each gas delivery system 114 may be configured to provide one or more gases to its respective processing chamber 104. In the embodiment depicted in FIG. 1, at least one of the gas delivery systems 114 is adapted to provide a process or precursor gas generated from a liquid precursor at a rate greater than about 1160 sccm (for example, 10 to at least about 100 grams per minute of TEOS).

Figure 2:
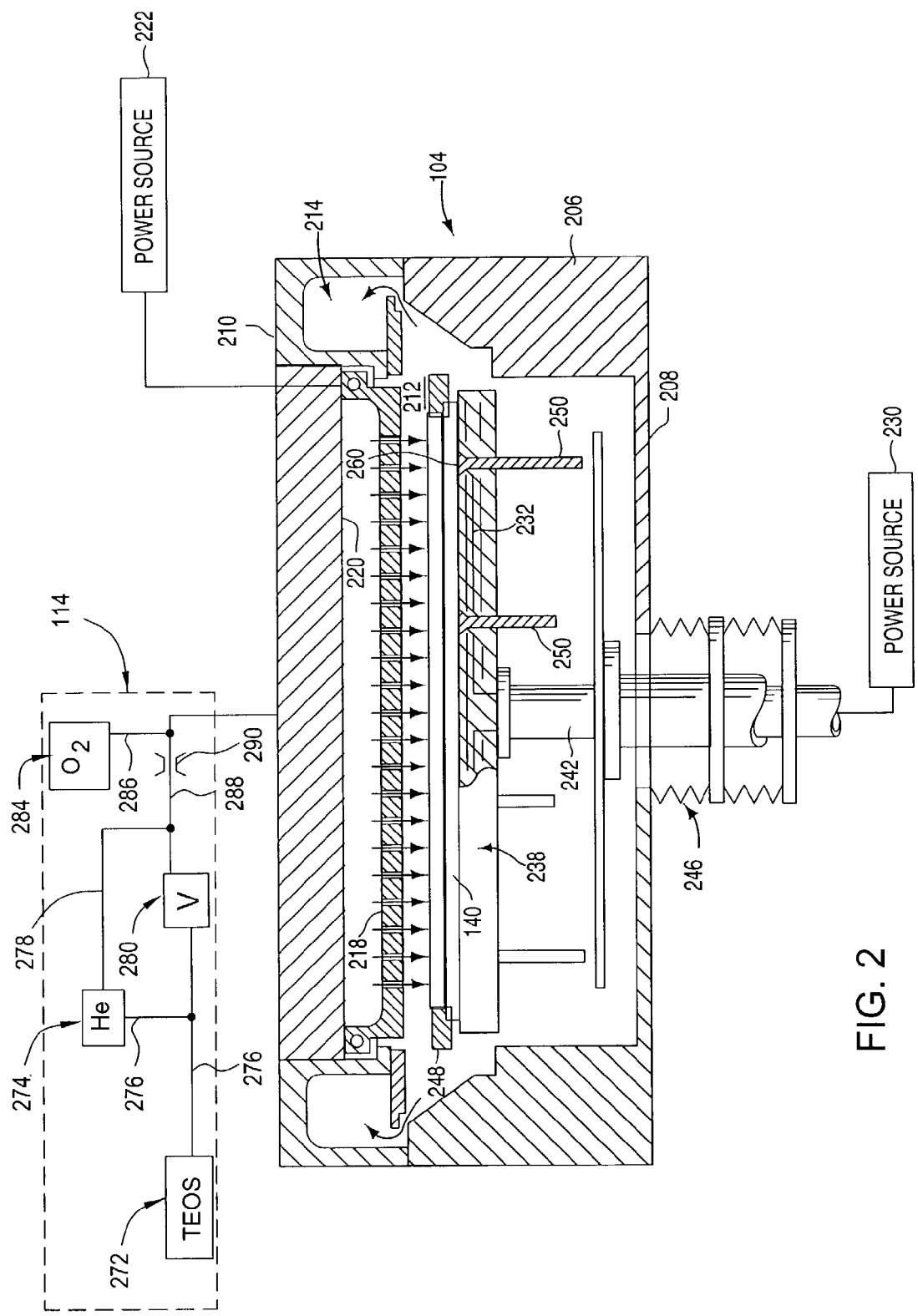
FIG. 2 depicts a sectional view of the processing chamber of FIG. 1 including one embodiment of the vaporizer module of the present invention.

FIG. 2 depicts a sectional view of the processing chamber 104 of FIG. 1 having one embodiment of the gas delivery system 114 coupled thereto. The processing chamber 104 has walls 206, a bottom 208, and a lid assembly 210 that define a process volume 212. The process volume 212 is typically accessed through a port (not shown) in the walls 206 that facilitates movement of a substrate 140 into and out of the processing chamber 104. The walls 206 and bottom 208 are typically fabricated from a unitary block of aluminum or other material compatible with processing chemistries. The lid assembly 210 contains a pumping plenum 214 that couples the process volume 212 to an exhaust port (that includes various pumping components, not shown).

The lid assembly 210 is supported by the walls 206 and can be removed to service the processing chamber 104. The lid assembly 210 is generally comprised of aluminum and may additionally contain heat transfer fluid channels for regulating the temperature of the lid assembly 210 by flowing heat transfer fluid therethrough.

A distribution plate 218 is coupled to an interior side 220 of the lid assembly 210. The distribution plate 218 is typically fabricated from aluminum and includes a perforated area through which process and other gases supplied from the gas delivery system 114 are delivered to the substrate 140 seated on the substrate support 238. The perforated area of the distribution plate 218 is configured to distribute process gas in a manner that promotes uniform deposition of material on the substrate 140.

A heated substrate support assembly 238 is centrally disposed within the processing chamber 104. The support assembly 238 supports the substrate 140 during processing. The support assembly 238 has a plurality of lift pins 250 movably disposed therethrough. The lift pins 250 may be actuated to project from the support surface 260, thereby placing the substrate in a spaced-apart relation to the support assembly 238 to facilitate substrate transfer with the transfer robot 112.

A vacuum port (not shown) is disposed through the support assembly 238 and is used to apply a vacuum between the substrate 140 and the support assembly 238, securing the substrate 140 to the support assembly 238 during processing. The heating element 232, such as an electrode disposed in the support assembly 238, is coupled to a power source 230, heating the support assembly 238 and the substrate 140 positioned thereon to a predetermined temperature. Typically, the heating element 232 maintains the substrate 140 at a uniform temperature of about 150 to at least about 460 degrees Celsius.

The support assembly 238 additionally supports a circumscribing shadow frame 248. The shadow frame 248 is configured to cover the edge of the substrate 140 and is typically comprised of ceramic. Generally, the shadow frame 248 prevents deposition at the edge of the substrate 140 and support assembly 238 so that the substrate does not stick to the support assembly 238. Optionally, a purge gas is supplied between the shadow frame 248 and the support assembly 238 to assist in preventing deposition at the substrate's edge.

The support assembly 238 is coupled by a stem 242 to a lift system (not shown) that moves the support assembly 238 between an elevated position (as shown) and a lowered position. A bellows 246 provides a vacuum seal between the chamber volume 212 and the atmosphere outside the processing chamber 104 while facilitating the movement of the support assembly 238. The stem 242 additionally provides a conduit for electrical leads, vacuum and gas supply lines between the support assembly 238 and other components of the system 100.

The support assembly 238 generally is grounded such that RF power supplied by a power source 222 to the distribution plate 218 (or other electrode positioned within or near the lid assembly of the chamber) may excite the gases disposed in the process volume 212 between the support assembly 238 and the distribution plate 218. The RF power, generally having a frequency of between a few Hz to 13 MHz or higher is provided in a wattage suitable for the substrate surface area. In one embodiment, the power source 222 comprises a dual frequency source that provides a low frequency power at less than about 2 MHz (preferably about 200 to 500 kHz) and a high frequency power at greater than 13 MHz (preferably about 13.56 MHz). The frequencies may be fixed or variable. Illustratively, for a 550 mm×650 mm substrate, the low frequency power is about 0.3 to about 2 kW while the high frequency power is about 1 to about 5 kW. Generally, the power requirements decrease or increase with a corresponding decrease or increase in substrate size.

The gas delivery system 114 includes a tetraethoxysilane (TEOS) source 272, a helium source 274, and a vaporizer module 280 coupled to the processing chamber 104 by a vaporizer output line 288. The TEOS source 272 includes piping, valves, flow controllers, and the like, for delivering a controlled quantity of liquid TEOS to the vaporizer module 280 through a vaporizer input line 276 which runs between the TEOS source 272 and the vaporizer module 280.

The helium source 274 includes piping, valves, flow controllers, and the like, for delivering a controlled quantity of helium gas. The helium can be used in the process as a purge gas by routing the helium from the helium source 274 through the vaporizer input line 276 to the vaporizer module 280. The helium can also be used as a carrier gas to carry the vaporized TEOS into the processing chamber 104 by routing the helium from the helium source 274 through a carrier gas line 278 that connects with the vaporizer output line 288.

Figure 3A:
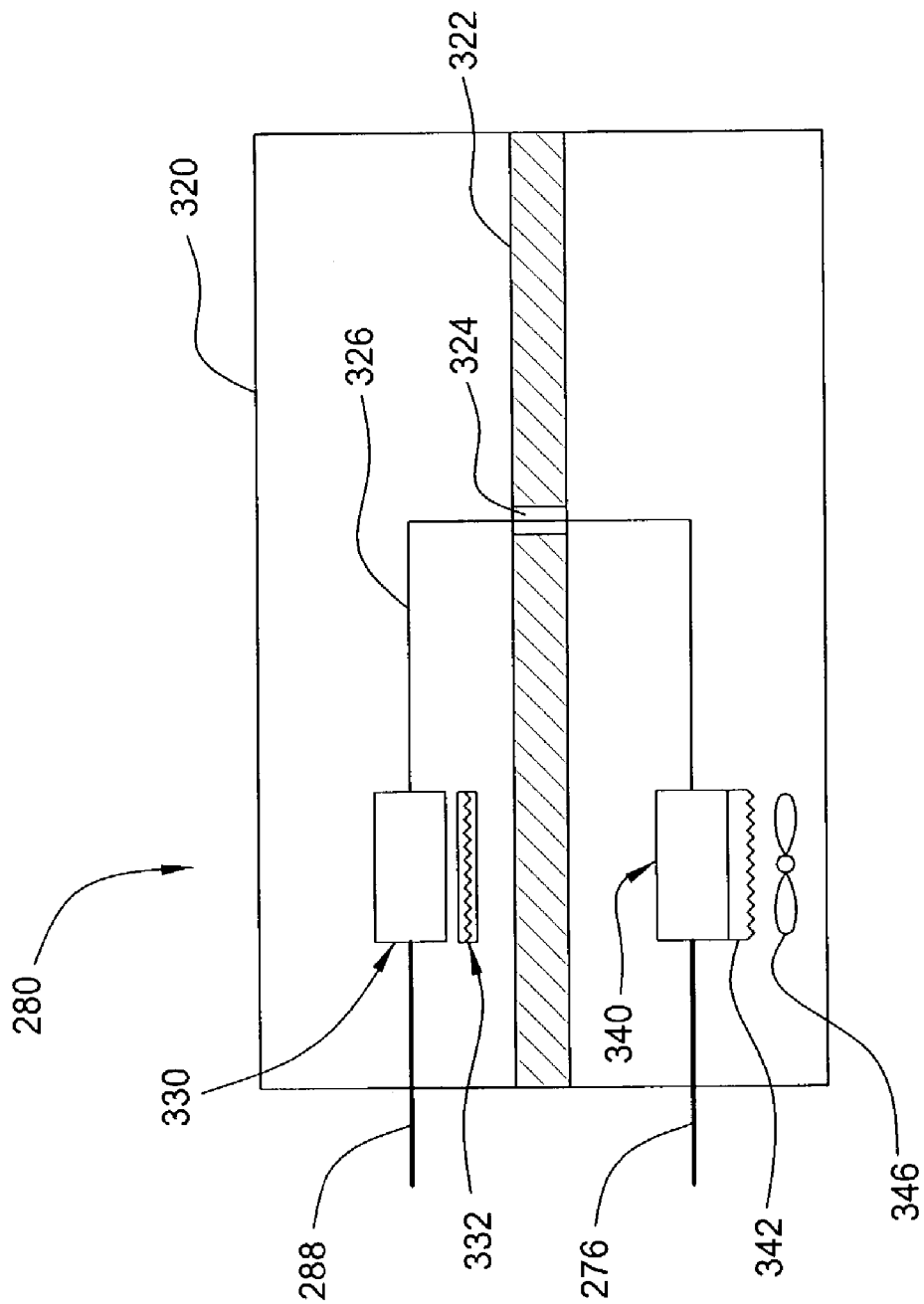
FIG. 3A is a sectional view of one embodiment of a vaporizer module of the present invention.

FIG. 3A depicts a schematic view of the vaporizer module 280. The vaporizer module is a container 320 that contains a liquid flow controller 340 and a vaporizer 330. The container 320 also contains an insulative divider 322 that thermally separates the flow controller 340 from the vaporizer 330. A conduit 326 runs through a passage 324 formed in the insulative divider 322 and couples the flow controller 340 to the vaporizer 330. The container 320 and the insulative divider 322 may be made of any suitable materials. In the embodiment shown, the container 320 is fabricated from stainless steel and the insulative divider 322 is fabricated from silicon rubber.

The flow controller 340 is coupled to the TEOS source 272 by vaporizer input line 276 and is coupled to the vaporizer 330 by the conduit 326. A heat sink 342 is mounted to the bottom of the flow controller 340. A fan 346 is disposed proximate the heat sink 342 and is oriented such that it blows air across the heat sink 342, thus maintaining the flow controller at approximately room temperature, or about 25 degrees Celsius. The flow controller 340 may be any device that controls the flow of a liquid, such as a mass or volumetric flow meter. One suitable flow controller 340 is a mass flow meter, model 2000PI, commercially available from Porter Instrument Company, located in Hatfield, Pa. By thermally isolating the flow controller 340 from the vaporizer 330, the temperature of the flow controller 340 may be more readily maintained at a predefined value for which flow readings provided by the controller 340 are within a known accurately and deviation, thus allowing more precise control over precursor generation.

The vaporizer 330 is coupled to the processing chamber 104 by the vaporizer output line 288 and to the flow controller 342 by the conduit 326. At least one heater 312 is coupled to the vaporizer module 280 and heats the TEOS in order to facilitate the vaporization of liquid TEOS into a gas phase. Although shown coupled to the vaporizer 330, the heater 312 may alternatively be disposed in or coupled to the conduit 326 or disposed in the vaporizer 330.

Figure 3B:
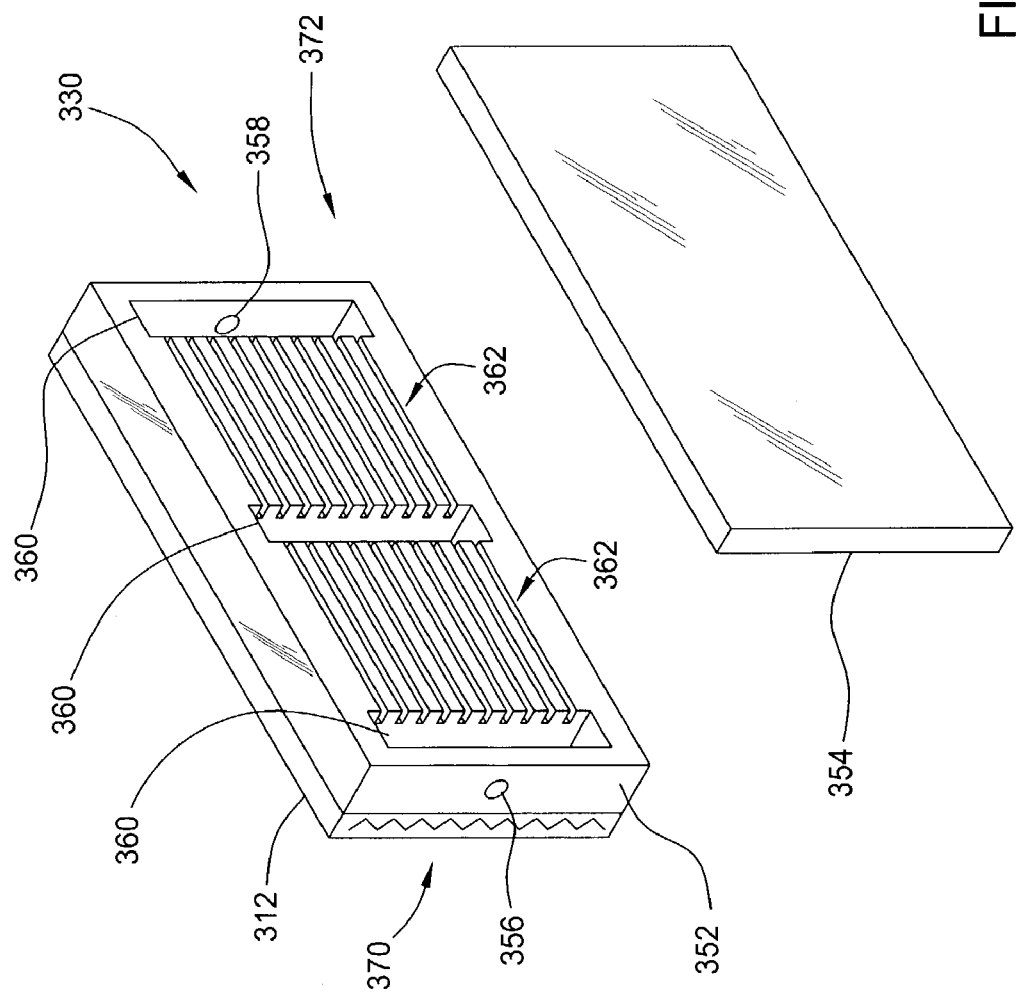
FIG. 3B is a sectional view of the vaporizer included in the vaporizer module of FIG. 3A.

FIG. 3B depicts an exploded view of one embodiment of the vaporizer 330. In one embodiment, the vaporizer 330 comprises a thermally conductive body 352 sealed with a thermally conductive cap 354. The body 352 has a plurality of transverse channels 360 and a plurality of longitudinal grooves 362 formed in one side. The body 352 is fabricated from a material inert to the processing chemistries and of sufficient thickness to retain its flatness during the fabrication of the plurality channels 360 and the plurality of grooves 362 and operation of the of the vaporizer 330 at temperatures of about 90 degrees Celsius and higher. It has been found that the body 352 may be fabricated from stainless steel having a thickness of at least about 0.125 inches. A stainless steel body thickness of about 0.100 inches or less has been found have poor TEOS vaporization performance, generally unsuitable for low defect deposition due to high liquid content in the output, as the body 352 is too flexible and/or easily warped during groove formation such that the gap between the body 352 and the cap 354 varies across the body 352 thereby allowing liquid/gas to flow outside of the grooves 362 preventing substantially complete vaporization.

The transverse channels 360 are disposed perpendicularly to the direction of flow through the vaporizer 330. One of the channels 360 is disposed near an inlet side 370 of the vaporizer 330 and is coupled to the conduit 326 via an inlet port 356 formed at least partially through the body 352. A second one of the channels 360 is disposed near an outlet side 372 of the vaporizer 330 and is coupled to the vaporizer output line 288 via an outlet port 358 (shown partially obscured in FIG. 3B) formed at least partially through the body 352.

The plurality longitudinal grooves 362 are formed in the body 352 and run parallel to the direction of flow through the vaporizer 330 and fluidly couple the plurality of channels 360 to each other. The grooves 362 are shallower than the channels 360 and are machined in order to maintain the flatness required to maintain separate flow streams of TEOS through adjacent grooves 362 to ensure complete vaporization. It has been found that the heat generated by chemical etching of the grooves 362 warps the body 352, thereby preventing stream isolation within the grooves 362 that substantially prevents complete vaporization of TEOS. Mixing of the flow streams will result in poor performance and excessive droplet generation, which is unacceptable for large area substrate processing. The cap 354 is fastened to the body 352, thereby forcing the fluid flowing through the vaporizer 330 to travel only within the plurality of channels 360 and the plurality of grooves 362 formed therein.

The grooves 362 are configured with sufficient surface area to ensure substantially complete vaporization of at least about 10 to at least about 100 grams per minute of TEOS. In one embodiment, at least 45 grooves 362 are formed in the body 352. Each groove 362 has a depth of about 0.007 inches and a width of about 0.015 inches.

The body 352 and cap 354 are heated by at least one heater 312 disposed against the body 352 and/or the cap 354 to heat the TEOS flowing through the channels 360 and grooves 362 to between about 90 to about 150 degrees Celsius, preferably 120 degrees Celsius. Liquid TEOS entering the vaporizer 330 is thus heated and forced to traverse the longitudinal grooves 362, producing TEOS vapor.

As the TEOS substantially vaporizes completely, the vacuum pump-down time has been substantially reduced. For example, large area substrate CVD systems utilizing vaporizer 330 have pump-down times of about 15 seconds when producing 5 g/min TEOS and about 18 seconds for conventional vaporizers producing 10 g/min TEOS as respectively compared to pump down times of 21 and 34 seconds for conventional vaporizers. Thus, the vaporizer 330 demonstrates a substantial reduction in the percent of liquid entering the processing chamber, thus enabling reduced cycle times and desirably increased substrate throughput as compared to conventional systems discussed above.

Additionally, the stabilization time and pressure stability of the vaporizer output is substantially improved over conventional vaporizers. For example, the inventive vaporizer has a stabilization time (i.e., time to steady state output) of about 10 seconds as compared to 20–45 second in conventional vaporizers when producing 10 grams per minute TEOS. The pressure stability of the inventive vaporizer is about ±2.82 percent as compared to ±6.09 percent in conventional vaporizers when producing 10 grams per minute TEOS.

Returning to additionally to FIG. 2, a restrictor 290 is disposed in the vaporizer output line 288 between the vaporizer 330 and the processing chamber 104. The restrictor 290 is configured to provide sufficient backpressure to the vaporizer 330 to that the vaporizing liquid does not expand so rapidly as to exit the vaporizer 330 before complete vaporization. Moreover, the restrictor 290 provides a stabilized flow of vaporized TEOS that enhances uniform and repeatable processing. In one embodiment, the restrictor 290 has an orifice of between about 0.187 and about 0.140 inches.

In order to prevent condensation of the vaporized TEOS before reaching the chamber 104, the vaporizer output line 288 and carrier gas line 278 are heated. This prevents cooling of the vaporized TEOS upon traveling through the vaporizer output line 288 or upon mixing with a colder, non-heated carrier gas. The lines 278, 288 may be heated by wrapping with heater tape, applying contact heaters, routing through heat transfer conduits, and the like. The vaporized TEOS or TEOS/carrier gas mixture flows through vaporizer output line 288 to the processing chamber 104. This combination of vaporizer module 280 and heated lines 288, 278 will allow vaporized TEOS to be delivered to the processing chamber 104 at a rate in excess of 10 grams per min. In other embodiments, vaporizer module 280 may be configured to deliver at least about 20 grams per minute, and up to and exceeding 100 grams per minute. One attribute of the vaporizer module 280 that facilitates higher capacity vaporizers is to increase the number of grooves 362 formed in the vaporizer module 280.

Oxygen gas is provided into the processing chamber from an oxygen source 284 that is coupled to the processing chamber by a plasma gas line 286. The oxygen gas mixes with the TEOS vapor and is excited in the processing chamber 104 to form a plasma. The TEOS decomposes in the plasma and deposits a layer of silicon oxide on the surface of a substrate located in the processing chamber 104.

Typically, a remote plasma source (not shown) is coupled to the processing chamber 104 and used to clean the chamber after a number of process cycles have been completed. The processing chamber may be cleaned after every cycle or after a predetermined number of cycles in order to maintain the required level of cleanliness within the chamber while minimizing costly downtime and product defects due to contamination.

Figure 4:
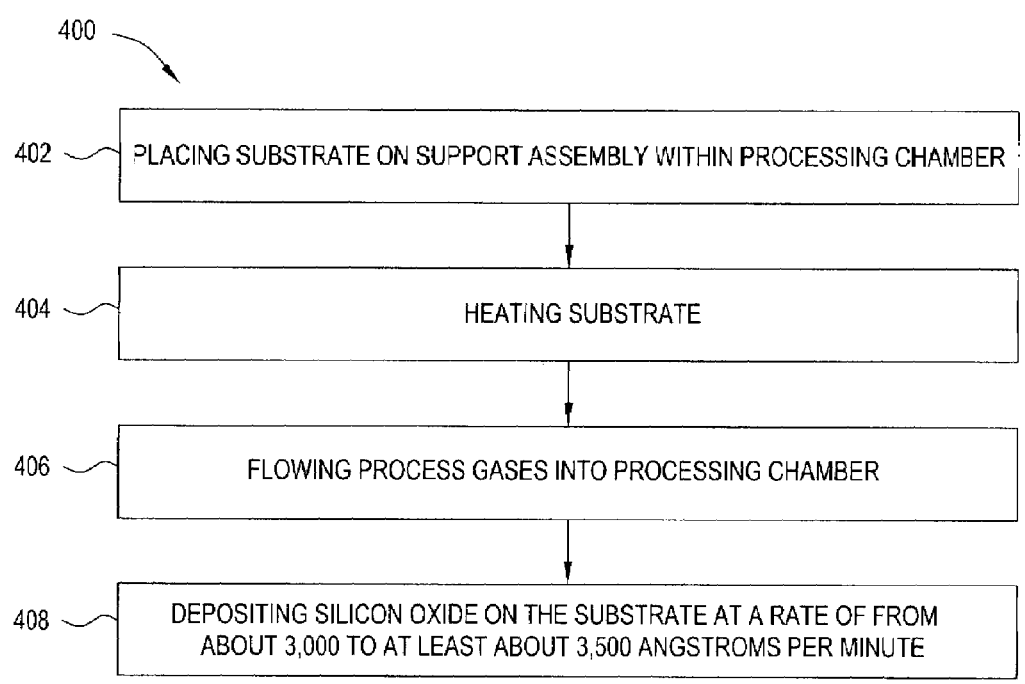
FIG. 4 depicts a flow diagram of one embodiment of a process in which the vaporizer module of FIG. 3A may be utilized.

FIG. 4 depicts a flow diagram for a method 400 for plasma enhanced chemical vapor deposition of a dielectric material on large area substrates. At step 402, referring to FIGS. 2–3, the substrate 140 is introduced into the processing chamber 104 and is placed on the substrate support assembly 238 within the processing chamber 104. The substrate 140 is held down by vacuum pressure and is covered around its periphery by the shadow frame 248.

At step 404, the substrate 140 is heated by heating element 232 to a temperature within the range of about 350 to about 440 degrees Celsius. Typically, the walls 206 of the processing chamber 104 are cooled to maintain the processing chamber 104 at a temperature in the range of from about 90 to about 150 degrees Celsius.

The process gases are introduced into the processing chamber 104 at step 406. In one embodiment, TEOS is supplied from the TEOS source 272 to the vaporizer 276 at a flow rate of from about 1,160 to about 11,600 sccm. The vaporizer 276 and the vaporizer output pipe 284 are maintained at a temperature of from about 90 to about 150 degrees Celsius, preferably 120 degrees Celsius. The TEOS flowing through the heated vaporizer is vaporized and the TEOS vapor flows out the vaporizer output pipe 284 into the processing chamber 104.

The TEOS vapor flowing through the vaporizer output pipe 284 enters the processing chamber 104 through the lid assembly 210. Oxygen gas flowing from the oxygen gas source 284 through the plasma gas line 286 is simultaneously introduced into the processing chamber 104 through the lid assembly 210. The oxygen gas flow rate is about 2,000 to about 15,000 sccm. The TEOS and oxygen gases mix and move into the process volume 212 through the gas distribution plate 218.

At step 408, a plasma is formed within the processing chamber 104 in the process volume 212 from the mixed TEOS and oxygen by applying about 5,000 W of RF energy from the power source 222 to the gas distribution plate 218. The TEOS decomposes in the plasma and deposits a layer of silicon oxide on the surface of the substrate at a rate of about 3000 to at least about 3500 Angstroms per minute on the exposed surface of a large area substrate having a one side surface area of at least about 0.357 m$^2$ when flowing TEOS at a rate of about 1,160 sccm. Deposition rates of about 14,000 Å/M may be realized at TEOS flow rates of 11,600 sccm.

In one embodiment, the substrate 140 is heated by heating element 232 to a temperature of about 440 degrees Celsius. TEOS is supplied from the TEOS source 272 to the vaporizer 276 at a flow rate of about at least about 10 grams per minute. The vaporizer is maintained at a temperature of about 120 degrees Celsius. The TEOS flowing through the heated vaporizer is vaporized and flows out the vaporizer output pipe 284 into the processing chamber 104. The vaporizer output pipe 284 is heated to a temperature of about 120 degrees Celsius to prevent condensation of TEOS vapor before entry into the processing chamber 104.

The TEOS vapor flowing through the vaporizer output pipe 284 enters the processing chamber 104 through the lid assembly 210. Oxygen gas flowing from the oxygen gas source 284 through the plasma gas line 286 is simultaneously introduced into the processing chamber 104 through the lid assembly 210 at a flow rate of about 2,000 sccm. The TEOS and Oxygen gases mix and move into the process volume 212 through the gas distribution plate 218. A plasma is formed in the process volume 212 from the mixed gases by applying about 5,000 W of RF energy from the power source 222 to the gas distribution plate 218 and a layer of silicon oxide is deposited on the surface of the substrate at a rate of about 3000 to at least about 4,000 Angstroms per minute.

The silicon oxide material deposited through the method 400 is not only deposited at a rate substantially greater than conventional processes, but the silicon oxide layer also exhibits robust physical properties. For example, the deposited silicon oxide has a stress in the range of −2.68 to 3.03; a refractive index of from about 1.45 to about 1.47; and a wet etch rate of from about 1,250 to about 3,100 Angstroms per minute, all of which compare favorably with conventionally applied materials deposited at much slower rates.

While the foregoing is directed to the preferred embodiment of the present invention, other and further embodiments of the invention may be devised without departing from the basic scope thereof. The scope of the invention is determined by the claims that follow.

What is claimed is:

1. A vaporizer module suitable for use in semiconductor processing, comprising:
   a first thermally conductive plate having a thickness of at least 0.125 inches having a first side;
   a second plate thermally conductive plate coupled to the first side of the first plate to define a vaporizer assembly;
   a plurality of grooves formed at least partially in the first plate and covered by the second plate,
   a first port formed in a first end of the vaporizer assembly; and
   a second port formed in a second end of the vaporizer assembly and fluidly coupled to the first port by the grooves.

2. The vaporizer module of claim 1 further comprising a restrictor coupled to the second port.

3. The vaporizer module of claim 2, wherein the restrictor has an orifice of about 0.140 to about 0.187 inches.

4. The vaporizer module of claim 1, wherein the grooves are machined and have enough surface area to vaporize at least 20 grams per minute of TEOS when heated to between about 90 to about 150 degrees Celsius.

5. The vaporizer module of claim 1, wherein the grooves are symmetrical and have enough surface area to vaporize at least 100 grams per minute of TEOS when heated to between about 90 to about 150 degrees Celsius.

6. A vaporizer module, comprising:
   a liquid flow controller;
   a temperature controller cooperating with the flow controller to maintain the flow controller at a predefined temperature; and
   a vaporizer having an inlet coupled to the flow controller and an outlet adapted to flow a gaseous precursor to a semiconductor processing chamber.

7. The vaporizer module of claim 6, further comprising:
   a thermally insulating member disposed between the vaporizer and the flow controller.

8. The vaporizer module of claim 7, wherein the insulating member is at least partially fabricated of silicon rubber.

9. The vaporizer module of claim 7, further comprising:
   a container housing the vaporizer and flow controller.

10. The vaporizer module of claim 6, wherein the vaporizer is heated to a temperature within the range of from about 90 degrees Celsius to about 150 degrees Celsius and the flow controller is maintained at about 25 degrees Celsius.

11. The vaporizer module of claim 10, wherein the vaporizer is heated to about 120 degrees Celsius.

12. The vaporizer module of claim 6, further comprising:
    a heat sink coupled to the flow controller.

13. The vaporizer module of claim 12, further comprising:
    a fan disposed proximate the heat sink and cooperating with the heat sink to cool the flow controller.

14. The vaporizer module of claim 6, wherein the flow controller is a mass flow meter.

15. The vaporizer module of claim 6, wherein the vaporizer further comprises:
    a first thermally conductive plate having a thickness of at least 0.125 inches having a first side;
    a second plate thermally conductive plate coupled to the first side of the first plate to define the vaporizer;
    a plurality of grooves machined at least partially in the first plate and covered by the second plate and coupling the inlet and outlet of the vaporizer.

16. The vaporizer module of claim 6 further comprising a restrictor coupled to the outlet.

17. The vaporizer module of claim 16, wherein the restrictor has an orifice of about 0.140 to about 0.187 inches.

* * * * *

UNITED STATES PATENT AND TRADEMARK OFFICE
CERTIFICATE OF CORRECTION

| | |
|---|---|
| PATENT NO. | : 7,031,600 B2 |
| APPLICATION NO. | : 10/409466 |
| DATED | : April 18, 2006 |
| INVENTOR(S) | : Sanjay D. Yadav, Quanyuan Shang and Wendell T. Blonigan |

Page 1 of 1

It is certified that error appears in the above-identified patent and that said Letters Patent is hereby corrected as shown below:

Column 2, Line 17: After "Therefore,", insert --there--

Column 8, Line 26: Change "Å/M" to --Å/min--

Column 9, Claim 1, Line 6: After "second", delete "plate"

Column 10, Claim 15, Line 25: After "second", delete "plate"

Signed and Sealed this

Nineteenth Day of September, 2006

JON W. DUDAS
*Director of the United States Patent and Trademark Office*